(12) United States Patent
Motwani

(10) Patent No.: US 9,842,022 B2
(45) Date of Patent: Dec. 12, 2017

(54) TECHNOLOGIES FOR REDUCING LATENCY IN READ OPERATIONS

(71) Applicant: Intel Corporation, Santa Clara, CA (US)

(72) Inventor: Ravi H. Motwani, San Diego, CA (US)

(73) Assignee: Intel Corporation, Santa Clara, CA (US)

( * ) Notice: Subject to any disclaimer, the term of this patent is extended or adjusted under 35 U.S.C. 154(b) by 24 days.

(21) Appl. No.: 15/001,358

(22) Filed: Jan. 20, 2016

(65) Prior Publication Data

US 2017/0206023 A1    Jul. 20, 2017

(51) Int. Cl.
| G06F 11/10 | (2006.01) |
| G11C 29/52 | (2006.01) |
| G06F 3/06 | (2006.01) |

(52) U.S. Cl.
CPC ........ *G06F 11/1048* (2013.01); *G06F 3/0611* (2013.01); *G06F 3/0659* (2013.01); *G06F 3/0679* (2013.01); *G06F 11/1008* (2013.01); *G06F 11/1068* (2013.01); *G11C 29/52* (2013.01)

(58) Field of Classification Search
CPC ... G06F 11/1048; G06F 11/1008; G11C 29/52
See application file for complete search history.

(56) References Cited

U.S. PATENT DOCUMENTS

| 8,953,373 | B1* | 2/2015 | Wu | G11C 16/3404 365/185.03 |
| 9,620,202 | B2* | 4/2017 | Chen | G11C 11/5642 |
| 2008/0215893 | A1* | 9/2008 | Bliss | H04K 1/00 713/189 |
| 2010/0185897 | A1* | 7/2010 | Abts | G06F 11/106 714/16 |
| 2011/0126079 | A1* | 5/2011 | Wu | G06F 11/1044 714/763 |
| 2011/0161775 | A1* | 6/2011 | Weingarten | G06F 11/1048 714/755 |
| 2011/0182119 | A1* | 7/2011 | Strasser | G11C 16/28 365/185.03 |
| 2012/0008386 | A1* | 1/2012 | Chilappagari | G11C 11/5642 365/185.2 |
| 2013/0297986 | A1* | 11/2013 | Cohen | G11C 29/52 714/763 |
| 2013/0297988 | A1* | 11/2013 | Wu | G06F 11/1068 714/773 |

(Continued)

*Primary Examiner* — Joseph D Torres
(74) *Attorney, Agent, or Firm* — Barnes & Thornburg LLP

(57) ABSTRACT

Technologies for reducing latency in read operations include an apparatus to perform a read attempt of a target data set from a memory, to obtain a candidate data set. A controller performs the read attempt using an initial read parameter, such as an initial read reference voltage. The controller is also to determine a candidate ratio of instances of data values in a portion of the candidate data set, compare the candidate ratio to a predefined reference ratio, determine whether the candidate ratio is within a predefined range of the predefined reference ratio, and, in response to a determination that the candidate ratio is not within the predefined range, adjust the read parameter and perform a subsequent read attempt of the target data set with the adjusted read parameter.

25 Claims, 6 Drawing Sheets

(56) References Cited

U.S. PATENT DOCUMENTS

| | | | |
|---|---|---|---|
| 2013/0343131 A1* | 12/2013 | Wu | G11C 16/26 365/185.24 |
| 2014/0040704 A1* | 2/2014 | Wu | G11C 29/52 714/773 |
| 2014/0056068 A1* | 2/2014 | Strasser | G06F 11/1048 365/185.03 |
| 2014/0143637 A1* | 5/2014 | Cohen | H03M 13/1108 714/773 |
| 2014/0355340 A1* | 12/2014 | Sharon | G11C 16/26 365/185.03 |
| 2015/0085573 A1* | 3/2015 | Sharon | G06F 11/1048 365/185.03 |

\* cited by examiner

TECHNOLOGIES FOR REDUCING LATENCY IN READ OPERATIONS

BACKGROUND

Some data storage devices perform an error correction process, such as an error-correcting code (ECC) algorithm, on a set of data that has been read from memory, to identify and correct any errors in the data. Those error correction processes may execute for a period of time and ultimately fail to correct all of the errors in the read data. That is, ECC algorithms are limited in the number of errors they are able to correct. When an error correction process fails to correct the errors, the data storage device performs a subsequent read attempt using adjusted parameters. Repeated read attempts that are each followed by execution of error correction processes may add latency to a read operation.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Figure 1:
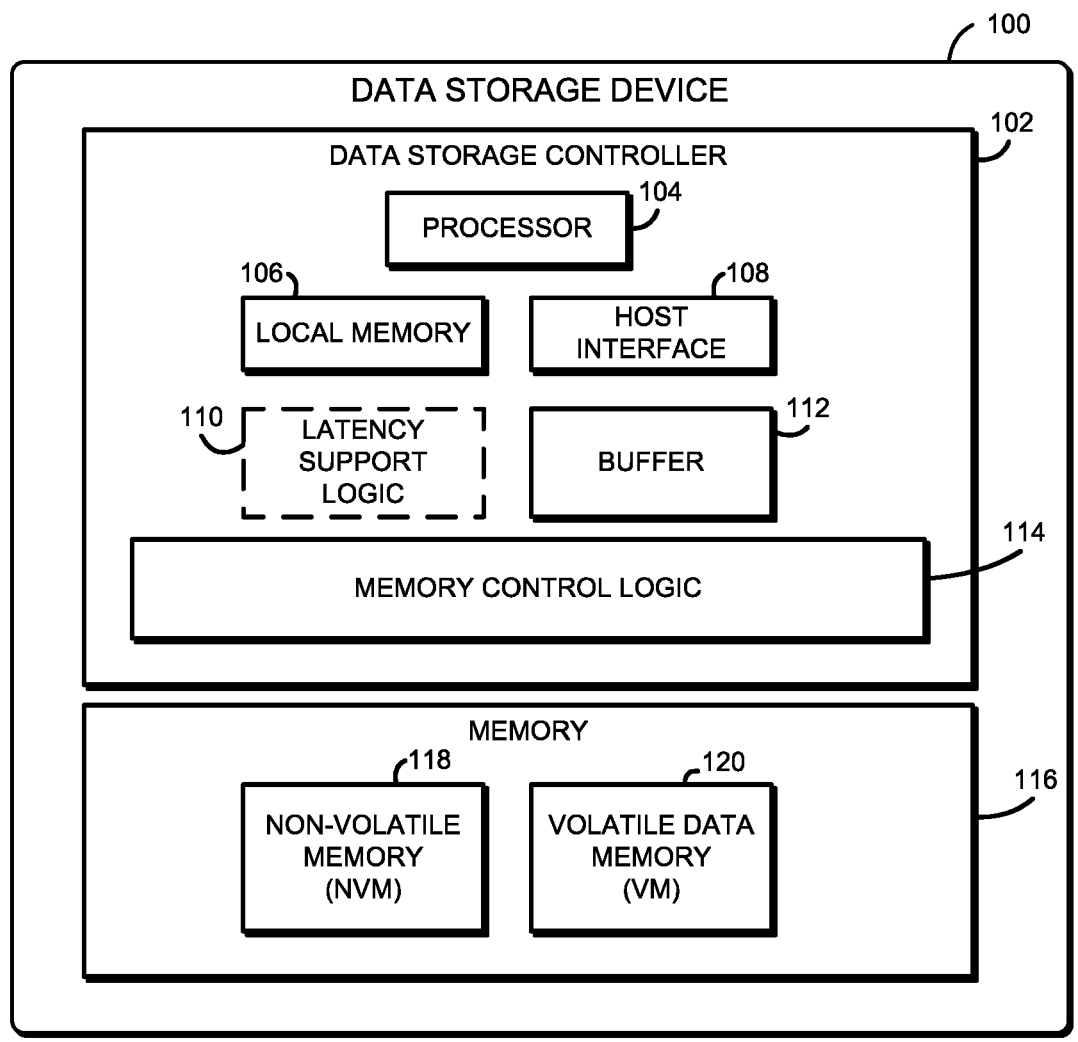
FIG. 1 is a simplified block diagram of at least one embodiment of a data storage device for reducing latency in read attempts.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C); (A and B); (A and C); (B and C); or (A, B, and C). Similarly, items listed in the form of "at least one of A, B, or C" can mean (A); (B); (C); (A and B); (A and C); (B and C); or (A, B, and C).

The disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

As shown in FIG. 1, an illustrative data storage device 100 for reducing latency in read attempts includes a data storage controller 102 and a memory 116, which illustratively includes non-volatile memory 118 and volatile memory 120. As discussed in more detail below, during use, the data storage controller 102 is configured to perform a read operation that reduces latency by predicting, based on predefined criteria, whether attempting to perform an error correction process on a data set read from the memory 116 will be unsuccessful. If the error correction process will be unsuccessful, the data storage controller 102 attempts to read the data set again using an adjusted read parameter, such as an adjusted read reference voltage, prior to attempting to perform the error correction process on the data. In other words, the data storage controller 102 avoids expending the time and energy to execute an error correction algorithm that will likely fail, and instead re-reads the data using an adjusted read parameter. The data storage controller 102 is also configured to store data in a manner that facilitates reducing latency in subsequent read operations of the data, as described in more detail herein.

The data storage device 100 may be embodied as any type device capable of storing data and performing the functions described herein. In the illustrative embodiment, the data storage device 100 is embodied as a solid state drive; however, in other embodiments, the data storage device 100 may embodied as a hard disk drive, a memory module device, a cache memory device, and/or other data storage device.

The data storage controller 102 of the data storage device 100 may be embodied as any type of control device, circuitry, or collection of hardware devices capable of reducing latency in read operations of the memory 116. In the illustrative embodiment, the data storage controller 102 includes a processor or processing circuitry 104, local memory 106, a host interface 108, latency support logic 110, a buffer 112, and memory control logic 114. Of course, the data storage controller 102 may include additional devices, circuits, and/or components commonly found in a drive controller of a solid state drive in other embodiments.

The processor 104 may be embodied as any type of processor capable of performing the functions described herein. For example, the processor 104 may be embodied as a single or multi-core processor(s), digital signal processor, microcontroller, or other processor or processing/controlling circuit. Similarly, the local memory 106 may be embodied as any type of volatile and/or non-volatile memory or data storage capable of performing the functions described herein. In the illustrative embodiment, the local memory 106 stores firmware and/or other instructions executable by the processor 104 to perform the described functions of the data storage controller 102. In some embodiments, the processor 104 and the local memory 106 may form a portion of a System-on-a-Chip (SoC) and be incorporated, along with other components of the data storage controller 102, onto a single integrated circuit chip.

The host interface 108 may also be embodied as any type of hardware processor, processing circuitry, input/output circuitry, and/or collection of components capable of facilitating communication of the data storage device 100 with a host device or service (e.g., a host application). That is, the host interface 108 embodies or establishes an interface for accessing data stored on the data storage device 100 (e.g., stored in the memory 116). To do so, the host interface 108 may be configured to utilize any suitable communication protocol and/or technology to facilitate communications with the data storage device 100 depending on the type of data storage device. For example, the host interface 108 may be configured to communicate with a host device or service using Serial Advanced Technology Attachment (SATA), Peripheral Component Interconnect express (PCIe), Serial Attached SCSI (SAS), Universal Serial Bus (USB), and/or other communication protocol and/or technology in some embodiments.

In the illustrative embodiment, the latency support logic 110 is embodied as dedicated circuitry and/or device configured to assist in reducing latency in read attempts of the memory 116. For example, the latency support logic 110 may be embodied as an co-processor, an application specific integrated circuit (ASIC), or other dedicated circuitry or device. In such embodiments, the latency support logic 110 provides a hardware accelerated implementation of at least a portion of the operations described herein. For example, in some embodiments, the latency support logic 110 includes one or more hardware counters configured to count instances of particular data values in a data set read from the memory 116. In some implementations, at least a portion of the latency support logic 110 is embodied in firmware or other processor-executable instructions.

The buffer 112 of the data storage controller 102 is embodied as volatile memory used by data storage controller 102 to temporarily store data that is being read from or written to memory 116. The particular size of the buffer 112 may be dependent on the total storage size of the memory 116. The memory control logic 114 is illustrative embodied as hardware circuitry and/or device configured to control the read/write access to data at particular storage locations of memory 116.

The non-volatile memory 118 may be embodied as any type of data storage capable of storing data in a persistent manner (even if power is interrupted to non-volatile memory 118). For example, in the illustrative embodiment, the non-volatile memory 118 is embodied as one or more non-volatile memory devices. The non-volatile memory devices of the non-volatile memory 118 are illustratively embodied as byte-addressable, write-in-place non-volatile memory devices. However, in other embodiments, the non-volatile memory 118 may be embodied as any combination of memory devices that use chalcogenide phase change material (e.g., chalcogenide glass), three-dimensional (3D) crosspoint memory, or other types of byte-addressable, write-in-place non-volatile memory, ferroelectric random-access memory (FeTRAM), nanowire-based non-volatile memory, phase change memory (PCM), memory that incorporates memristor technology, Magnetoresistive random-access memory (MRAM) or Spin Transfer Torque (STT)-MRAM.

The volatile memory 120 may be embodied as any type of data storage capable of storing data while power is supplied volatile memory 120. For example, in the illustrative embodiment, the volatile memory 120 is embodied one or more volatile memory devices, and is periodically referred to hereinafter as volatile memory 120 with the understanding that the volatile memory 120 may be embodied as other types of non-persistent data storage in other embodiments. The volatile memory devices of the volatile memory 120 are illustratively embodied as dynamic random-access memory (DRAM) devices, but may be embodied as other types of volatile memory devices and/or memory technologies capable of storing data while power is supplied to volatile memory 120.

Figure 2:
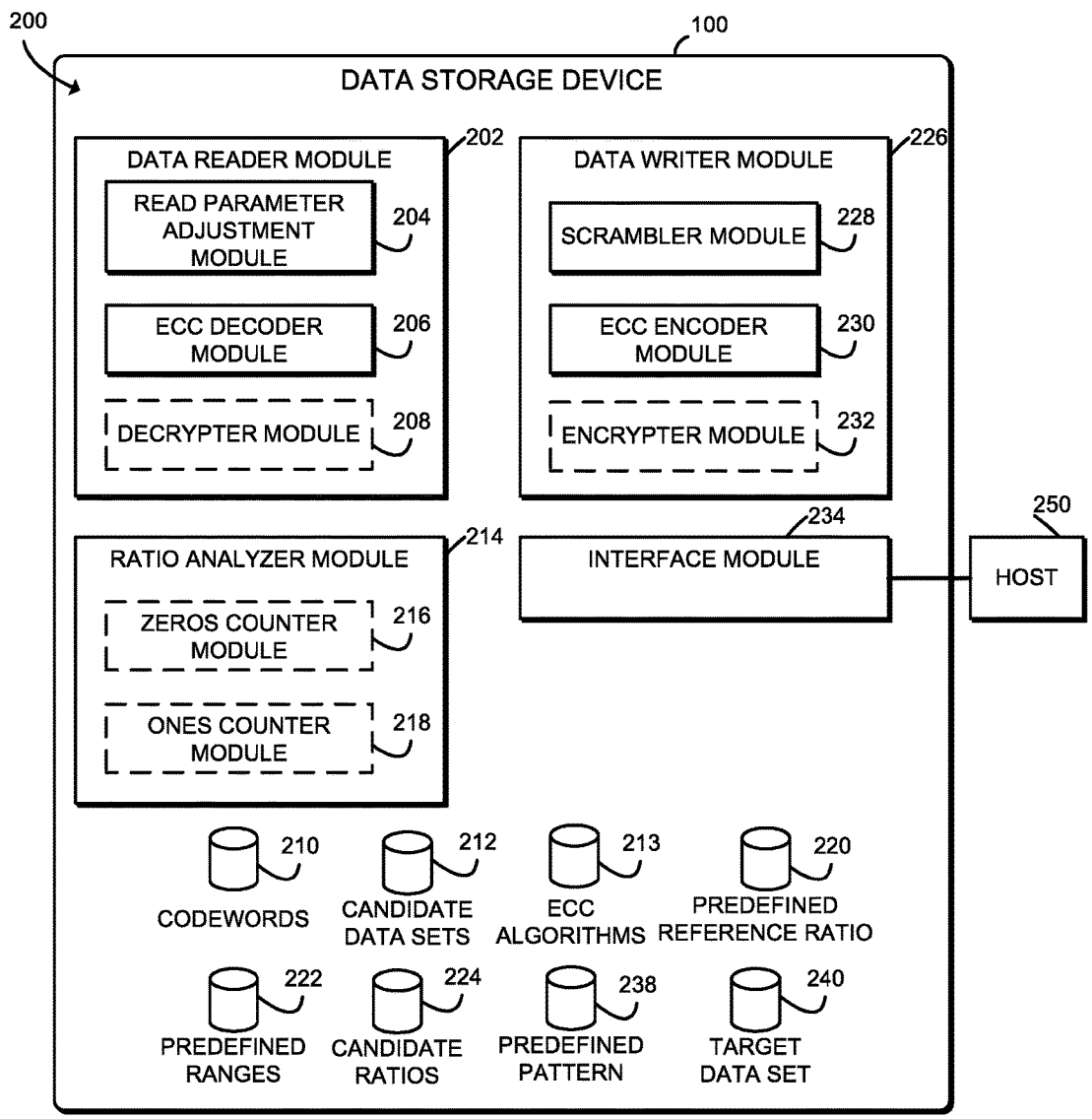
FIG. 2 is a simplified block diagram of at least one embodiment of an environment that may be established by the data storage device of FIG. 1.

Referring now to FIG. 2, in use, the data storage device 100 may establish an environment 200. The illustrative environment 200 includes a data reader module 202, which includes a read parameter adjustment module 204, an error correction code (ECC) decoder module 206, and a decrypter module 208. Additionally, the illustrative environment 200 includes a ratio analyzer module 214, which includes a zeros counter module 216 and a ones counter module 218. Further, the illustrative environment 200 includes a data writer module 226 that includes a scrambler module 228, an ECC encoder module 230, and an encrypter module 232. The illustrative environment 200 also includes an interface module 234. Each of the modules and other components of the environment 200 may be embodied as firmware, software, hardware, or a combination thereof. For example the various modules, logic, and other components of the environment 200 may form a portion of, or otherwise be established by, the data storage controller 102 or other hardware components of the data storage device 100. As such, in some embodiments, any one or more of the modules of the environment 200 may be embodied as a circuit or collection of electrical devices (e.g., a data reader circuit 202, a ratio analyzer circuit 204, a data writer circuit 226, an interface circuit 234, etc.).

The data reader module 202 is configured to read data from the memory 116 in response to a read request. For example, the memory 116 includes a target data set 240 that the data reader module 202 attempts to read in response to a read request. When the data reader module 202 attempts to read the target data set 240, the data reader module 202 obtains a candidate data set 212. More specifically, the data reader module 202 performs a read attempt using a read parameter that affects how the memory 116 is read. In the illustrative embodiment, the read parameter is a read reference voltage, but may be embodied as any type of parameter or characteristic of the data storage device 100 that may affect the accuracy of read data. During operation, the read reference voltage may drift (i.e., inadvertently increase or decrease), causing the data reader module 202 to incorrectly read the target data set 240. In such instances, the read parameter adjustment module 204 is configured to adjust the read parameter, for example by increasing or decreasing the reference voltage, and the data reader module 202 will perform a subsequent attempt to read the target data set 240 using the adjusted read parameters to obtain a subsequent candidate data set 212.

The ECC decoder module 206 of the data reader module 202 is configured to perform an ECC decode process on a candidate data set 212. To do so, the ECC decoder module 206 identifies an error correction codeword 210 stored in association with (e.g., within) the candidate data set 212, performs a ECC decode process on the candidate data set 212 to generate another error correction codeword 210, and compares the error correction codeword 210 that was stored in association with the candidate data set 212 to the generated error correction codeword to determine if they are equal. The ECC decoder module 206 is further configured to correct a limited number of errors in the candidate data set using an ECC algorithm 213. In some embodiments, the candidate data set 212 may be encrypted. In such embodiments, the decrypter module 208 decrypts the candidate data set 212, for example after the ECC decoder module 206 has executed the ECC algorithm 213 on the candidate data set 212. As described herein, the ECC decoder module 206 and the decrypter module 208 only receive and operate upon a candidate data set 212 that meets predefined criteria, described in more detail below. If a candidate data set 212 does not meet the predefined criteria, the data reader module 202 performs a subsequent read attempt using an adjusted read parameter to obtain a subsequent candidate data set 212.

In use, the ratio analyzer module 214 calculates a ratio (a candidate ratio 224) of instances of data values in the candidate data set 212 to determine whether the candidate data set 212 meets the predefined criteria. For example, in the illustrative embodiment, the zeros counter module 216 counts a number zeros in the candidate data set 212 and the ones counter module 218 counts a number of ones in the candidate data set 212. The ratio analyzer module 214 subsequently calculates the candidate ratio 224 as the ratio of zeros to ones (or ones to zeros). Further, the ratio analyzer module 214 compares the candidate ratio 224 to a predefined reference ratio 220. For example, the predefined reference ratio 220 may be one to one, meaning an equal number of zeros and ones. Further, the ratio analyzer module 214 determines whether the candidate ratio 224 is within a predefined range 222 (e.g., 10%) of the predefined reference ratio 220. If the candidate ratio 224 is within the predefined range 222 of the predefined reference ratio 220, then the candidate data set 212 meets the predefined criteria and the data reader module 202 passes the candidate data set 212 to the ECC decoder module 206 for processing, as described above. If the candidate ratio 224 is not within the predefined range 222 of the predefined reference ratio 220, then the data reader module 202 adjusts the read parameter and performs a subsequent read attempt, as described above. In at least some embodiments, the ratio analyzer module 214 selects a particular predefined range from a set of predefined ranges 222 based on a particular ECC algorithm 213 that will be used by the ECC decoder module 206 to process the candidate data set 212. For example, the various ECC algorithms 213 may be capable of correcting different amounts of errors in a candidate data set 212. Accordingly, one ECC algorithm may be associated with a predefined range of, for example 10%, while another ECC algorithm may be associated with a different predefine range of, for example 20%, meaning the second algorithm is capable of correcting more errors than the first one.

The data writer module 226 is configured to store target data sets 240 to the memory 116 in a manner that enables the ratio analyzer module 214 to operate as described above. To do so, the ECC encoder module 230 performs an ECC algorithm 213 on a target data set 240, thereby generating an error correction codeword 210. Further, the scrambler module 228 scrambles the codeword 210 to ensure that the codeword 210 has the predefined reference ratio 220 of instances of one data value to another data value (e.g., ratio of zeros to ones). In the illustrative embodiment the scrambler module 228 scrambles the codeword 210 by combining the codeword 210 with a predefined pattern 238 that has the predefined reference ratio 220 of zeros to ones. For example, in the illustrative embodiment, the scrambler module 228 combines the predefined pattern 238 with the codeword 210 by performing an exclusive OR ("XOR") of the predefined pattern 238 with the codeword 210. In at least some embodiments, the encrypter module 232 encrypts the target data set 240, for example before the ECC encoder module 230 and the scrambler module 228 process the target data set 240.

The interface module 234 is configured to handle data storage requests and data read requests received from a host 250, which may be embodied as an application, service, and/or other device. To do so, the interface module 234 identifies a received request and any data and/or parameters associated with the request, and transmits these items to the data reader module 202 or the data writer module 226, depending on the type of request. In response to a read request, the interface module 234 transmits the data read (e.g., the target data set 240) by the data reader module 202 to the host 250. In response to a write request, the interface module 234 transmits a result of the request to the host 250, for example a confirmation that the write request was received and/or completed.

Figure 3:
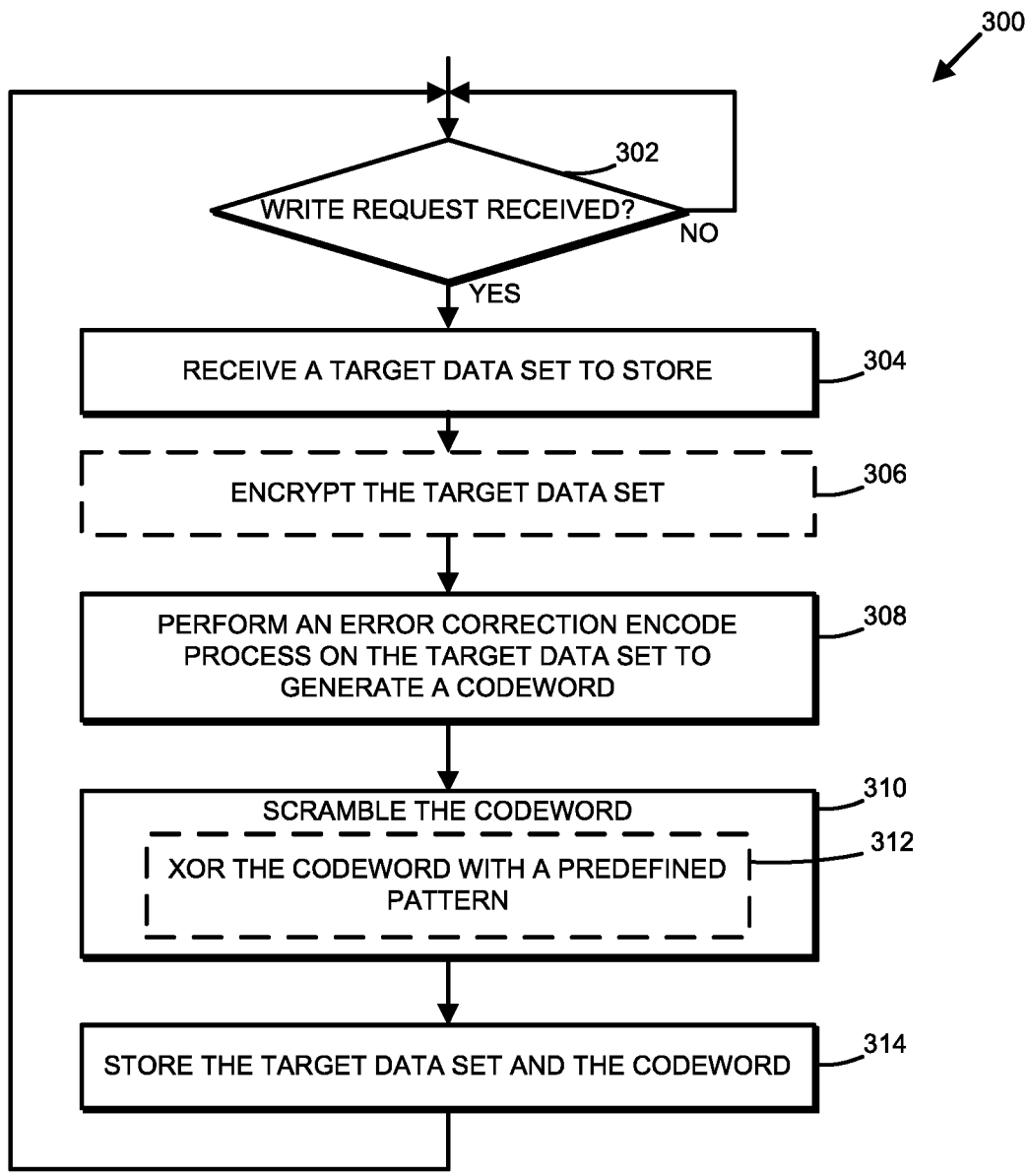
FIG. 3 is a simplified flow diagram of at least one embodiment of a method for storing data that may be executed by the data storage device of FIGS. 1 and 2.

Referring now to FIG. 3, in use, the data storage controller 102 of the data storage device 100 may execute a method 300 for storing data in a manner that facilitates reducing the latency in read operations. The method 300 begins with block 302 in which the data storage controller 102 determines whether a write request has been received (e.g., from the host 250). If a write request has been received, the method 300 advances to block 304. In block 304, the data storage controller 102 receives a target data set 240 to store to the memory 116. For example, in some embodiments, the write instruction may include a memory address to the target data set 240, and the data storage controller 102 retrieves the target data set 240 from memory using the address. In other embodiments, such as when the target data set 240 is relatively small, the target data set 240 may be included as a parameter of the write instruction. In block 306, in the illustrative embodiment, the data storage controller 102 encrypts the target data set 240. However, in other embodiments, the data storage controller 102 may not encrypt the target data set 240. In block 308, the data storage controller 102 performs an error correction encode process (e.g., one of ECC algorithms 213) on the target data set 240 to generate an error correction codeword 210. Additionally, in block 310, the data storage controller 102 scrambles the error correction codeword 210 that was generated at block 308. To do so, in some embodiments, the data storage controller 102 scrambles the error correction codeword 210 by XORing or otherwise combining the error correction codeword 210 with the predefined pattern 238 in block 312. As described above, the predefined pattern 238, in the illustrative embodiment, is a predefined pattern of ones and zeros in accordance with the predefined reference ratio 220 (e.g., 50% ones and 50% zeros). Subsequently, in block 314, the data storage controller 102 stores the target data set 240 with the error correction codeword 210 in the memory 116. The method 300 loops back to block 302 in which the data storage controller 102 continues to monitor for additional write requests.

Figure 4:
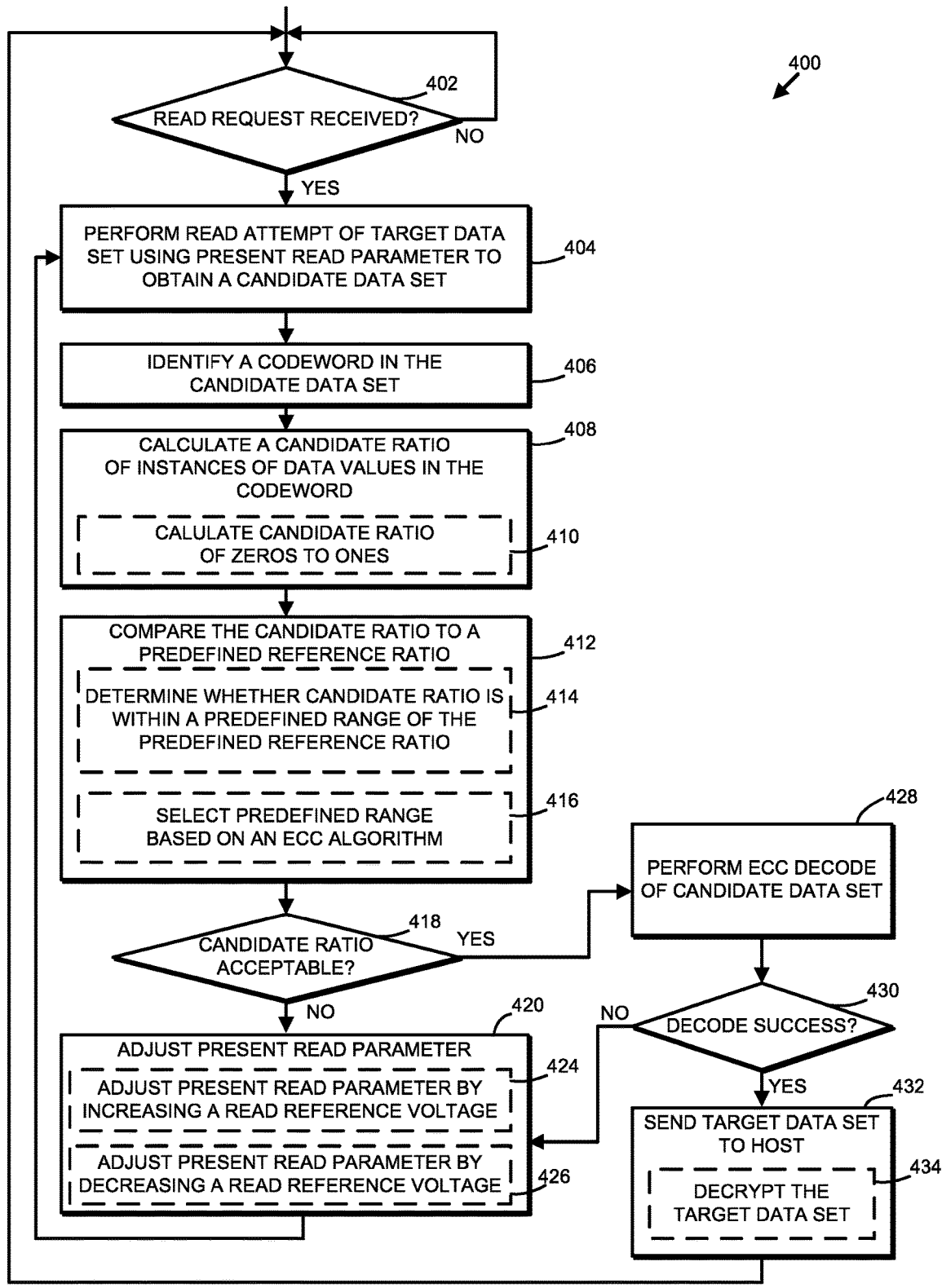
FIG. 4 is a simplified flow diagram of at least one embodiment of a method for reducing latency in a read operation that may be executed by the data storage device of FIGS. 1 and 2.

Referring now to FIG. 4, in use, the data storage controller 102 of the data storage device 100 may execute a method 400 for reducing latency in a read operation. The method 400 begins at block 402 in which the data storage controller 102 determines whether a read request has been received (e.g., from the host 250). In some embodiments, the read request may specify an address of a target data set 240 to read from the memory 116. If such a read request is received, the method 400 advances to block 404 in which the data storage controller 102 performs a read attempt of the target data set 240 and obtains a candidate data set 212. In performing the read attempt, the data storage controller 102 uses the present value of a read parameter, for example an initial read reference voltage.

In block 406, the data storage controller 102 identifies an error correction codeword 210 stored within the candidate data set 212 and, in block 408, calculates a candidate ratio 224 of instances of data values in the error correction codeword 210. For example, as indicated in block 410 the data storage controller 102 may calculate a ratio of zeros to ones in the error correction codeword 210. In some embodiments, the error correction codeword 210 is stored separate from the candidate data set 212. In block 412, the data storage controller 102 compares the candidate ratio 224 to a predefined reference ratio 220. For example, in the illustrative embodiment, the predefined reference ratio is one to one, meaning 50% zeros and 50% ones. In some embodiments, in block 414, the data storage controller 102 may determine whether the candidate ratio 224 is within a predefined range 222 of the predefined reference ratio 220. For example, the predefined range 222 in the illustrative embodiment is 10%. Accordingly, if the candidate ratio is 48 zeros to 52 ones, the data storage controller 102 determines that the candidate ratio 224 is within the predefined range 222 of the of the predefined reference ratio 220. Additionally, in some embodiments, the data storage controller 102 may select the predefined range 222 from a set of predefined ranges based on the particular ECC algorithm 213 that will be applied to the candidate data set 212 in block 416. For example, one ECC algorithm may be able to correct more errors than another ECC algorithm. Accordingly, the one ECC algorithm may be capable of correcting all of the errors in a candidate data set when the candidate ratio is off by 20% from the predefined reference ratio 220, while the other ECC algorithm can only correct all of the errors in the candidate data set if the candidate data set has a candidate ratio that is within 10% of the predefined reference ratio 220. An ECC algorithm can be chosen for use in block 428 based on a difference between the candidate ratio and the predefined reference ratio 220.

Subsequently, in block 418 the data storage controller 102 determines whether the candidate ratio 224 is acceptable. For example, in the illustrative embodiment, the data storage controller 102 is configured to determine that the candidate ratio 224 is acceptable if the candidate ratio 224 is within the predefined range (e.g., 10%) of the predefined reference ratio 220. In other embodiments, the data storage controller 102 may determine that the candidate ratio 224 is acceptable only if it is identical to the predefined reference ratio 220.

Regardless, if the data storage controller 102 determines that the candidate ratio 224 is not acceptable, the method 400 advances to block 420. In block 420, the data storage controller 102 adjusts the present read parameter. For example, the data storage controller 102 may increase a read reference voltage, as shown in block 424, or decrease the read reference voltage, as shown in block 426. In some embodiments, the data storage controller 102 adjusts the read reference voltage by a fixed amount, for example by 100 millivolts. In other embodiments, the data storage controller 102 adjusts the read reference voltage by an amount that is proportional to the difference between the candidate ratio 224 and the predefined reference ratio 220. For example, if the candidate ratio 224 differs from the predefined reference ratio 220 by 30%, the data storage controller 102 adjusts the read reference voltage by a greater amount than if the candidate ratio 224 differs from the predefined reference ratio 220 by 15%. In some embodiments, the data storage controller 102 adjusts the read reference voltage according to a Gaussian probability density function. More specifically, the data storage controller 102 may be preconfigured with values for a mean and a variance of a Gaussian probability density function that defines the relationship of read reference voltages and the corresponding ratios of zeros to ones. In such embodiments, the data storage controller 102 adjusts the read reference voltage towards the center of the Gaussian probability density function (e.g., towards a ratio of 50% zeros to 50% ones) using the standard Q function of the Gaussian probability density function. Regardless, after the data storage controller 102 has adjusted the read parameter (e.g., the read reference voltage), the method 400 loops back to block 404 in which the data storage controller 102 performs another read attempt of the target data set using the adjusted read parameter.

Referring back to block 418, if the data storage controller 102 determines that the candidate ratio 224 is acceptable, the method 400 advances to block 428. In block 428, the data storage controller 102 performs an ECC decode process on the candidate data set 212. For example, the data storage controller 102 may calculate an error correction codeword 210 from the candidate data set 212 and compare the calculated error correction codeword 210 to the error correction codeword identified at block 406. If the error correction codewords are identical, the data storage controller 102 determines that the candidate data set 212 is identical to the target data set 240 and there are no errors to correct. However, in some instances, the data storage controller 102 may correct one or more errors in the candidate data set using the selected ECC algorithm 213. In some embodiments, the data storage controller 102 executes a Bose-Chaudhuri-Hocquenghem (BCH) error correction algorithm in block 428. In other embodiments, the data storage controller 102 executes a Reed-Solomon error correction algorithm In yet other embodiments, the data storage controller 102 applies a different error correction algorithm in block 428.

After the data storage controller 102 has performed the ECC decode on the candidate data set in block 428, the method 400 advances to block 430. In block 430, the data storage controller 102 determines whether the ECC decode process performed at block 428 was successful. For example, the data storage controller 102 may determine whether all of the errors present in the candidate data set 212 were corrected. In some embodiments, the data storage controller 102 determines that all errors were corrected by generating an error correction codeword from the candidate data set 212 after the error correction process has been performed, comparing the generated error correction codeword to the error correction codeword 210 identified in block 406, and if the error correction codewords are identical, determining that all errors were corrected. If all errors in the candidate data set 212 have been corrected, as described above, the corrected candidate data set 212 is identical to the target data set 240. If all errors were not corrected, the method 400 advances to block 420 in which the data storage controller 102 adjusts the present read parameter. However, if the ECC decode process was successful, the method 400 advances to block 432 in which the data storage controller 102 sends the target data set 240 to the host 250. In some embodiments, for example embodiments in which the target data set 240 is encrypted, the data storage controller 102 decrypts the target data set 240 in block 434 prior to sending the target data set 240 to the host 250. After the data storage controller 102 sends the target data set 240 to the host 250, the method 400 returns to block 402 in which the data storage controller 102 monitors for additional read requests.

Figure 5:
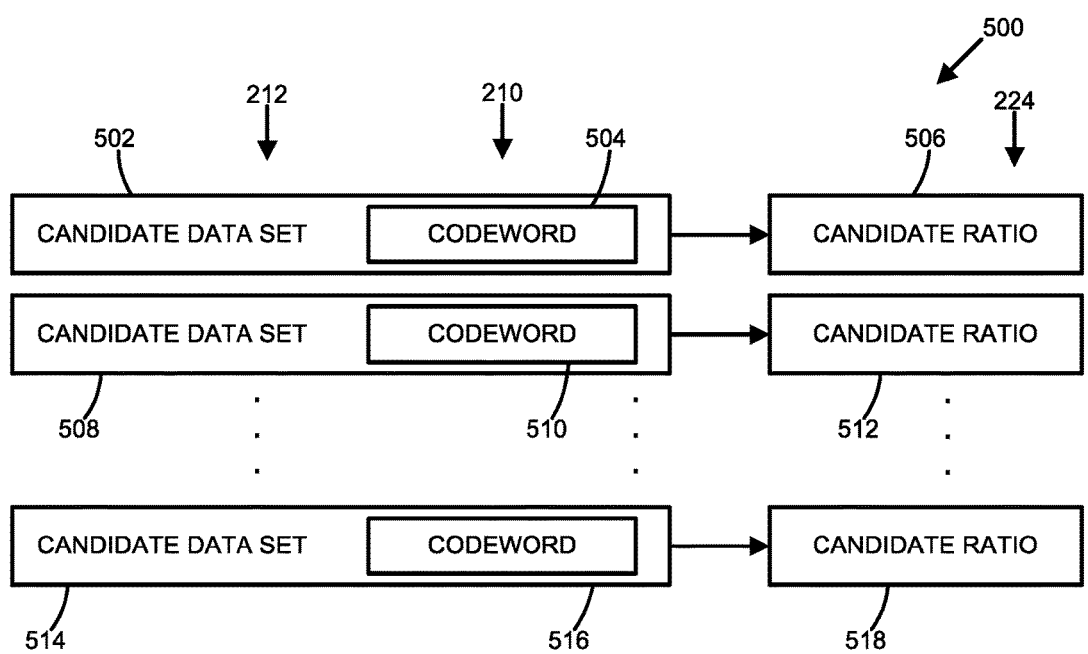
FIG. 5 is a simplified block diagram of a relationship among candidate data sets read by the data storage device, codewords associated with the candidate data sets, and ratios of data values calculated by the data storage device of FIGS. 1 and 2.

Referring now to FIG. 5, a simplified block diagram of a relationship 500 among candidate data sets 212 read by the data storage device, error correction codewords 210 associated with the candidate data sets 212, and candidate ratios 224 is shown. More specifically, as an example, the data storage controller 102 may read the target data set 240 from memory 116 using an initial read reference voltage of, for example, 100 millivolts, to generate candidate data set 502. The candidate data set 502 is associated with an error correction codeword 504. In the illustrative embodiment, the error correction codeword 504 is included within the candidate data set 502, but the error correction codeword may be stored separate from the candidate data set 502. The error correction codeword 504 has a candidate ratio 506 associated therewith. In the illustrative embodiment, the candidate ratio 506 is the ratio of instances of two different data values (e.g., zeros and ones) within the error correction codeword 504. For example, if the candidate ratio 506 differs from the predefined reference ratio 220 by more than the predefined range 222, the data storage controller 102 increases the read reference voltage by, for example, 100 millivolts, and generates another candidate data set 508 by performing a subsequent attempted read of the target data set 240. The candidate data set 508 includes an error correction codeword 510, but the error correction codeword 510 may be stored separate from the candidate data set 508. The data storage controller 102 calculates an associated candidate ratio 512 associated with the codeword 510. The data storage controller 102 may perform several more read attempts at different read reference voltages until the data storage controller obtains a candidate data set 514 that includes an error correction codeword 516. More specifically, the data storage controller 102 calculates a candidate ratio 518 associated with the error correction codeword 516. When the candidate ratio 518 is within the predefined range 222 of the predefined reference ratio 220, the data storage controller 102 determines that an ECC algorithm 213 will be able to correct any errors in the candidate data set, and proceeds with executing the ECC algorithm 213, as described with reference to the method 400 shown in FIG. 4. Further, in some embodiments, the data storage controller 516 deletes the previous candidate data sets (e.g., candidate data sets 502, 508). Accordingly, various embodiments potentially avoid use of time and power involved with use of an ECC scheme until the candidate ratio 518 is within the predefined range 222.

Figure 6:
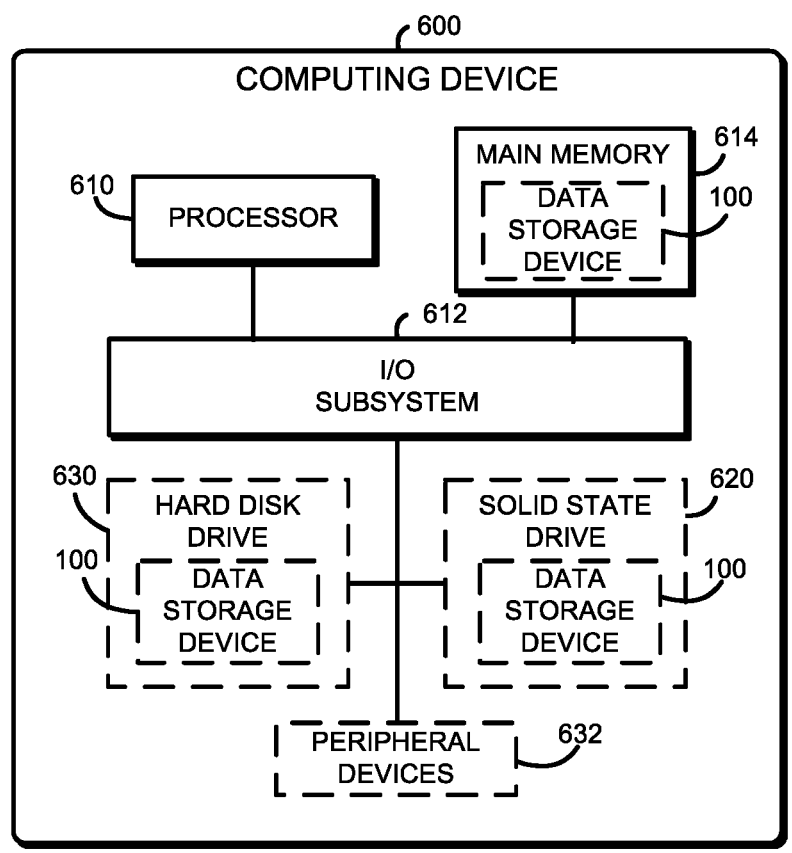
FIG. 6 is a simplified block diagram of at least one embodiment of a computing device including the data storage device of FIGS. 1 and 2.

Referring now to FIG. 6, in some embodiments, the data storage device 100 may be incorporated in, or form a portion of, a computing device 600. The computing device 600 may be embodied as any type of computing device in which the data storage device 100 may be used. For example, the computing device 600 may be embodied as a smart phone, a tablet computer, a notebook, a laptop computer, a netbook, an Ultrabook™, a wearable computing device, a pair of smart glasses, a head-mounted computing device, a cellular phone, a desktop computer, a smart device, a personal digital assistant, a mobile Internet device, a server, a data storage device, and/or any other computing/communication device. As shown in FIG. 6, the illustrative computing device 600 includes a processor 610, an input/output ("I/O") subsystem 612, and a main memory 614. Of course, the computing device 600 may include other or additional components, such as those commonly found in a typical computing device (e.g., various input/output devices and/or other components), in other embodiments. Additionally, in some embodiments, one or more of the illustrative components may be incorporated in, or otherwise form a portion of, another component. For example, the memory 614, or portions thereof, may be incorporated in the processor 610 in some embodiments.

The processor 610 may be embodied as any type of processor capable of performing the functions described herein. For example, the processor 610 may be embodied as a single or multi-core processor(s), digital signal processor, microcontroller, or other processor or processing/controlling circuit. Similarly, the memory 614 may be embodied as any type of volatile or non-volatile memory or data storage capable of performing the functions described herein. In operation, the memory 614 may store various data and software used during operation of the computing device 600 such as operating systems, applications, programs, libraries, and drivers. The memory 614 is communicatively coupled to the processor 610 via the I/O subsystem 612, which may be embodied as circuitry and/or components to facilitate input/output operations with the processor 610, the memory 614, and other components of the computing device 600. For example, the I/O subsystem 612 may be embodied as, or otherwise include, memory controller hubs, input/output control hubs, firmware devices, communication links (i.e., point-to-point links, bus links, wires, cables, light guides, printed circuit board traces, etc.) and/or other components and subsystems to facilitate the input/output operations.

As shown in FIG. 6, the data storage device 100 may be incorporated in, or form a portion of, one or more other components of the computing device 600. For example, the data storage device 100 may be embodied as, or otherwise be included in, the main memory 614. Additionally or alternatively, the data storage device 100 may be embodied as, or otherwise included in, a solid state drive 620 of the computing device 600. Further, in some embodiments, the data storage device 100 may be embodied as, or otherwise included in, a hard disk drive 630 of the computing device 600. Of course, in other embodiments, the data storage device 100 may be included in or form a portion of other components of the computing device 600.

Reference to memory devices can apply to different memory types, and in particular, any memory that has a bank group architecture. Memory devices generally refer to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR4 (DDR version 4, initial specification published in September 2012 by JEDEC), DDR4E (in development by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (currently in discussion by JEDEC), HBM2 (HBM version 2), currently in discussion by JEDEC), and/or others, and technologies based on derivatives or extensions of such specifications.

In addition to, or alternatively to, volatile memory, in one embodiment, reference to memory devices can refer to a nonvolatile memory device whose state is determinate even if power is interrupted to the device.

EXAMPLES

Illustrative examples of the technologies disclosed herein are provided below. An embodiment of the technologies may include any one or more, and any combination of, the examples described below.

Example 1 includes an apparatus comprising a memory to store a target data set; and a controller to manage read attempts of the target data set, wherein the controller is to perform, in response to a read request, a first read attempt of the target data set from the memory with a read parameter to obtain a first candidate data set; determine a first candidate ratio of instances of data values in at least a first portion of the first candidate data set; compare the first candidate ratio to a predefined reference ratio; determine whether the first candidate ratio is within a predefined range of the predefined reference ratio; adjust the read parameter in response to a determination that the first candidate ratio is not within the predefined range; and perform a second read attempt of the target data set with the adjusted read parameter.

Example 2 includes the subject matter of Examples 1, and wherein the controller is further to selectively increase or decrease a read reference voltage to adjust the read parameter.

Example 3 includes the subject matter of Example 1 and 2, and wherein the controller is further to identify an error correction codeword associated with the first candidate data set; and determine the first candidate ratio as a ratio of zeros to ones in the error correction codeword.

Example 4 includes the subject matter of Examples 1-3, and wherein the controller is further to in response to a determination that the first candidate ratio is within the predefined range, perform an error correction process on the first candidate data set.

Example 5 includes the subject matter of Examples 1-4, and wherein the controller is further to perform an error correction encode process on the target data set to generate an error correction codeword associated with the target data set; scramble the error correction codeword; and store the target data set and the error correction codeword to the memory prior to the first read attempt.

Example 6 includes the subject matter of Examples 1-5, and wherein the controller is further to perform an exclusive OR of a predefined pattern of ones and zeros with the error correction codeword to scramble the error correction codeword.

Example 7 includes the subject matter of Examples 1-6, and wherein the controller is further to perform the second read attempt to obtain a second candidate data set; and determine whether the second candidate data set has a second candidate ratio of zeros to ones that is within the predefined range of the predefined reference ratio.

Example 8 includes the subject matter of Examples 1-7, and wherein the controller is further to perform an error correction process on the second candidate data set to obtain the target data set in response to a determination that the second candidate ratio is within the predefined range of the predefined reference ratio.

Example 9 includes the subject matter of Examples 1-8, and wherein the error correction process is one or more of a Reed-Solomon error correction process or a Bose-Chaudhuri-Hocquenghem (BCH) error correction process.

Example 10 includes the subject matter of Examples 1-9, and further including one or more of at least one processor communicatively coupled to the memory, a network interface communicatively coupled to a processor, a display communicatively coupled to a processor, or a battery coupled to the apparatus.

Example 11 includes the subject matter of Examples 1-10, and wherein the controller is further to perform an encryption process on the target data set; and store the target data set to the memory prior to the first read attempt.

Example 12 includes the subject matter of Examples 1-11, and wherein the controller is further to compare the first candidate ratio to a predefined reference ratio of one to one.

Example 13 includes the subject matter of Examples 1-12, and wherein the controller is further to determine whether the first candidate ratio is within ten percent of the predefined reference ratio.

Example 14 includes the subject matter of Examples 1-13, and wherein the controller is further to select the predefined range as one of a first predefined range stored in association with a first error correction process and a second predefined range that is different from the first predefined range and is stored in association with a second error correction process that is different from the first error correction process.

Example 15 includes the subject matter of Examples 1-14, and wherein the controller is further to generate a read failure code after a predefined number of read attempts of the target data set.

Example 16 includes the subject matter of Examples 1-15, and wherein the controller is further to decrypt the target data set after a successful read attempt of the target data set.

Example 17 includes the subject matter of Examples 1-16, and wherein the controller is further to receive a write request from a host; perform, in response to the write request, an encryption process on the target data set; and store the target data set to the memory prior to the first read attempt.

Example 18 includes the subject matter of Examples 1-17, and wherein the controller is further to adjust the read parameter by an amount that is proportional to a difference between the first candidate ratio and the predefined reference ratio.

Example 19 includes the subject matter of Examples 1-18, and wherein the controller is further to adjust the read parameter by selectively increasing or decreasing a read reference voltage by 100 millivolts.

Example 20 includes the subject matter of Examples 1-19, and further including a buffer, wherein the controller is further to receive the read request from a host; perform an error correction process on the first candidate data set, in response to a determination that the first candidate ratio is within the predefined range; and provide the first candidate data set to the host.

Example 21 includes the subject matter of Examples 1-20, and wherein the memory is byte-addressable.

Example 22 includes a method comprising performing, by a controller of an apparatus and in response to a read request, a first read attempt of a target data set from a memory of the apparatus with a read parameter to obtain a first candidate data set; determining, by the controller, a first candidate ratio of instances of data values in at least a first portion of the first candidate data set; comparing, by the controller, the first candidate ratio to a predefined reference ratio; determining, by the controller, whether the first candidate ratio is within a predefined range of the predefined reference ratio; adjusting, by the controller, the read parameter in response to a determination that the first candidate ratio is not within the predefined range; and performing, by the controller, a second read attempt of the target data set with the adjusted read parameter.

Example 23 includes the subject matter of Example 22, and further including selectively increasing or decreasing a read reference voltage to adjust the read parameter.

Example 24 includes the subject matter of Examples 22 and 23, and further including identifying an error correction codeword associated with the first candidate data set; and determining the first candidate ratio as a ratio of zeros to ones in the error correction codeword.

Example 25 includes the subject matter of Examples 22-24, and further including performing an error correction encode process on the target data set to generate an error correction codeword associated with the target data set; combining the error correction codeword with a predefined set of data values; and storing the target data set and the error correction codeword to the memory prior to the first read attempt.

Example 26 includes the subject matter of Examples 22-25, and further including performing an error correction encode process on the target data set to generate an error correction codeword associated with the target data set; scrambling the error correction codeword; and storing the target data set and the error correction codeword to the memory prior to the first read attempt.

Example 27 includes the subject matter of Examples 22-26, and further including performing an exclusive OR of a predefined pattern of ones and zeros with the error correction codeword to scramble the error correction codeword.

Example 28 includes the subject matter of Examples 22-27, and further including performing the second read attempt to obtain a second candidate data set; and determining whether the second candidate data set has a second candidate ratio of zeros to ones that is within the predefined range of the predefined reference ratio.

Example 29 includes the subject matter of Examples 22-28, and further including performing an error correction process on the second candidate data set to obtain the target data set in response to a determination that the second candidate ratio is within the predefined range of the predefined reference ratio.

Example 30 includes the subject matter of Examples 22-29, and further including performing a Reed-Solomon error correction process on the second candidate data set to obtain the target data set in response to a determination that the second candidate ratio is within the predefined range of the predefined reference ratio.

Example 31 includes the subject matter of Examples 22-30, and further including performing a Bose-Chaudhuri-Hocquenghem (BCH) error correction process on the second candidate data set to obtain the target data set in response to a determination that the second candidate ratio is within the predefined range of the predefined reference ratio.

Example 32 includes the subject matter of Examples 22-31, and further including performing an encryption process on the target data set; and storing the target data set to the memory prior to the first read attempt.

Example 33 includes the subject matter of Examples 22-32, and further including comparing the first candidate ratio to a predefined reference ratio of one to one.

Example 34 includes the subject matter of Examples 22-33, and further including determining whether the first candidate ratio is within ten percent of the predefined reference ratio.

Example 35 includes the subject matter of Examples 22-34, and further including selecting the predefined range as one of a first predefined range stored in association with a first error correction process and a second predefined range that is different from the first predefined range and is stored in association with a second error correction process that is different from the first error correction process.

Example 36 includes the subject matter of Examples 22-35, and further including generating a read failure code after a predefined number of read attempts of the target data set.

Example 37 includes the subject matter of Examples 22-36, and further including decrypting the target data set after a successful read attempt of the target data set.

Example 38 includes the subject matter of Examples 22-37, and further including receiving a write request from a host; performing, in response to the write request, an encryption process on the target data set; and storing the target data set to the memory prior to the first read attempt.

Example 39 includes the subject matter of Examples 22-38, and further including adjusting the read parameter by an amount that is proportional to a difference between the first candidate ratio and the predefined reference ratio.

Example 40 includes the subject matter of Examples 22-39, and further including adjusting the read parameter by selectively increasing or decreasing a read reference voltage by 100 millivolts.

Example 41 includes the subject matter of Examples 22-40, and further including receiving the read request from a host; obtaining a second candidate data set from the second read attempt; determining a second candidate ratio based on the second candidate data set; determining that the second candidate ratio is within the predefined range of the predefined reference ratio; performing, in response to a determination that a second candidate ratio is within the predefined range, an error correction process on a second candidate data set; and providing the second candidate data set to the host.

Example 42 includes the subject matter of Examples 22-41, and wherein performing the first read attempt further comprises performing the first read attempt from byte-addressable non-volatile memory.

Example 43 includes one or more machine-readable storage media comprising a plurality of instructions stored thereon that, when executed, cause an apparatus to perform the method of any of Examples 22-42.

Example 44 includes an apparatus comprising means for performing, in response to a read request, a first read attempt of a target data set from a memory of the apparatus with a read parameter to obtain a first candidate data set; means for determining a first candidate ratio of instances of data values in at least a first portion of the first candidate data set; means for comparing the first candidate ratio to a predefined reference ratio; means for determining whether the first candidate ratio is within a predefined range of the predefined reference ratio; means for adjusting the read parameter in response to a determination that the first candidate ratio is not within the predefined range; and means for performing a second read attempt of the target data set with the adjusted read parameter.

Example 45 includes the subject matter of Example 44, and further including means for selectively increasing or decreasing a read reference voltage to adjust the read parameter.

Example 46 includes the subject matter of Examples 44 and 45, and further including means for identifying an error correction codeword associated with the first candidate data set; and means for determining the first candidate ratio as a ratio of zeros to ones in the error correction codeword.

Example 47 includes the subject matter of Examples 44-46, and further including means for performing an error correction encode process on the target data set to generate an error correction codeword associated with the target data set; means for combining the error correction codeword with a predefined set of data values; and means for storing the target data set and the error correction codeword to the memory prior to the first read attempt.

Example 48 includes the subject matter of Examples 44-47, and further including means for performing an error correction encode process on the target data set to generate an error correction codeword associated with the target data set; means for scrambling the error correction codeword; and means for storing the target data set and the error correction codeword to the memory prior to the first read attempt.

Example 49 includes the subject matter of Examples 44-48, and further including means for performing an exclusive OR of a predefined pattern of ones and zeros with the error correction codeword to scramble the error correction codeword.

Example 50 includes the subject matter of Examples 44-49, and further including means for performing the second read attempt to obtain a second candidate data set; and means for determining whether the second candidate data set has a second candidate ratio of zeros to ones that is within the predefined range of the predefined reference ratio.

Example 51 includes the subject matter of Examples 44-50, and further including means for performing an error correction process on the second candidate data set to obtain the target data set in response to a determination that the second candidate ratio is within the predefined range of the predefined reference ratio.

Example 52 includes the subject matter of Examples 44-51, and further including means for performing a Reed-Solomon error correction process on the second candidate data set to obtain the target data set in response to a determination that the second candidate ratio is within the predefined range of the predefined reference ratio.

Example 53 includes the subject matter of Examples 44-52, and further including means for performing a Bose-Chaudhuri-Hocquenghem (BCH) error correction process on the second candidate data set to obtain the target data set in response to a determination that the second candidate ratio is within the predefined range of the predefined reference ratio.

Example 54 includes the subject matter of Examples 44-53, and further including means for performing an encryption process on the target data set; and means for storing the target data set to the memory prior to the first read attempt.

Example 55 includes the subject matter of Examples 44-54, and further including means for comparing the first candidate ratio to a predefined reference ratio of one to one.

Example 56 includes the subject matter of Examples 44-55, and further including means for determining whether the first candidate ratio is within ten percent of the predefined reference ratio.

Example 57 includes the subject matter of Examples 44-56, and further including means for selecting the predefined range as one of a first predefined range stored in association with a first error correction process and a second predefined range that is different from the first predefined range and is stored in association with a second error correction process that is different from the first error correction process.

Example 58 includes the subject matter of Examples 44-57, and further including means for generating a read failure code after a predefined number of read attempts of the target data set.

Example 59 includes the subject matter of Examples 44-58, and further including means for decrypting the target data set after a successful read attempt of the target data set.

Example 60 includes the subject matter of Examples 44-59, and further including means for receiving a write request from a host; means for performing, in response to the write request, an encryption process on the target data set; and means for storing the target data set to the memory prior to the first read attempt.

Example 61 includes the subject matter of Examples 44-60, and further including means for adjusting the read parameter by an amount that is proportional to a difference between the first candidate ratio and the predefined reference ratio.

Example 62 includes the subject matter of Examples 44-61, and further including means for adjusting the read parameter by selectively increasing or decreasing a read reference voltage by 100 millivolts.

Example 63 includes the subject matter of Examples 44-62, and further including means for receiving the read request from a host; means for obtaining a second candidate data set from the second read attempt; means for determining a second candidate ratio based on the second candidate data set; means for determining that the second candidate ratio is within the predefined range of the predefined reference ratio; means for performing, in response to a determination that a second candidate ratio is within the predefined range, an error correction process on a second candidate data set; and means for providing the second candidate data set to the host.

Example 64 includes the subject matter of Examples 44-63, and wherein the means for performing the first read attempt comprises means for performing the first read attempt from byte-addressable non-volatile memory.

The invention claimed is:
1. An apparatus comprising:
a memory to store a target data set; and
a controller to manage read attempts of the target data set, wherein the controller is to:
perform, in response to a read request, a first read attempt of the target data set from the memory with a read parameter to obtain a first candidate data set;
determine a first candidate ratio of instances of data values in at least a first portion of the first candidate data set;

compare the first candidate ratio to a predefined reference ratio;
select a predefined range as one of a first predefined range stored in association with a first error correction process and a second predefined range that is different from the first predefined range and is stored in association with a second error correction process that is different from the first error correction process;
determine whether the first candidate ratio is within the selected predefined range of the predefined reference ratio;
adjust the read parameter in response to a determination that the first candidate ratio is not within the selected predefined range; and
perform a second read attempt of the target data set with the adjusted read parameter.

2. The apparatus of claim 1, wherein the controller is further to selectively increase or decrease a read reference voltage to adjust the read parameter.

3. The apparatus of claim 1, wherein the controller is further to:
identify an error correction codeword associated with the first candidate data set; and
determine the first candidate ratio as a ratio of zeros to ones in the error correction codeword.

4. The apparatus of claim 1, wherein the controller is further to:
in response to a determination that the first candidate ratio is within the predefined range, perform an error correction process on the first candidate data set.

5. The apparatus of claim 1, wherein the controller is further to:
perform an error correction encode process on the target data set to generate an error correction codeword associated with the target data set;
scramble the error correction codeword; and
store the target data set and the error correction codeword to the memory prior to the first read attempt.

6. The apparatus of claim 5, wherein the controller is further to perform an exclusive OR of a predefined pattern of ones and zeros with the error correction codeword to scramble the error correction codeword.

7. The apparatus of claim 1, wherein the controller is further to:
perform the second read attempt to obtain a second candidate data set; and
determine whether the second candidate data set has a second candidate ratio of data values in at least a first portion of the second candidate data set that is within the selected predefined range of the predefined reference ratio.

8. The apparatus of claim 7, wherein the controller is further to perform an error correction process on the second candidate data set to obtain the target data set in response to a determination that the second candidate ratio is within the selected predefined range of the predefined reference ratio.

9. The apparatus of claim 7, wherein the error correction process is one or more of a Reed-Solomon error correction process or a Bose-Chaudhuri-Hocquenghem (BCH) error correction process.

10. The apparatus of claim 1, further comprising one or more of:
at least one processor communicatively coupled to the memory,
a network interface communicatively coupled to a processor,
a display communicatively coupled to a processor, or
a battery coupled to the apparatus.

11. The apparatus of claim 1, wherein to determine whether the first candidate ratio is within the selected predefined range comprises to determine whether the first candidate ratio is within ten percent of the predefined reference ratio.

12. One or more machine-readable storage media comprising a plurality of instructions stored thereon that, when executed, cause an apparatus to:
perform, in response to a read request, a first read attempt of a target data set from a memory of the apparatus with a read parameter to obtain a first candidate data set;
determine a first candidate ratio of instances of data values in at least a first portion of the first candidate data set;
compare the first candidate ratio to a predefined reference ratio;
select a predefined range as one of a first predefined range stored in association with a first error correction process and a second predefined range that is different from the first predefined range and is stored in association with a second error correction process that is different from the first error correction process;
determine whether the first candidate ratio is within the selected predefined range of the predefined reference ratio;
adjust the read parameter in response to a determination that the first candidate ratio is not within the selected predefined range; and
perform a second read attempt of the target data set with the adjusted read parameter.

13. The one or more machine-readable storage media of claim 12, wherein the plurality of instructions, when executed, further cause the apparatus to selectively increase or decrease a read reference voltage to adjust the read parameter.

14. The one or more machine-readable storage media of claim 12, wherein the plurality of instructions, when executed, further cause the apparatus to:
identify an error correction codeword associated with the first candidate data set; and
determine the first candidate ratio as a ratio of zeros to ones in the error correction codeword.

15. The one or more machine-readable storage media of claim 12, wherein the plurality of instructions, when executed, further cause the apparatus to:
perform an error correction encode process on the target data set to generate an error correction codeword associated with the target data set;
scramble the error correction codeword; and
store the target data set and the error correction codeword to the memory prior to the first read attempt.

16. The one or more machine-readable storage media of claim 15, wherein the plurality of instructions, when executed, further cause the apparatus to perform an exclusive OR of a predefined pattern of ones and zeros with the error correction codeword to scramble the error correction codeword.

17. The one or more machine-readable storage media of claim 12, wherein the plurality of instructions, when executed, further cause the apparatus to:
perform the second read attempt to obtain a second candidate data set; and
determine whether the second candidate data set has a second candidate ratio of data values in at least a first portion of the second candidate data set that is within the selected predefined range of the predefined reference ratio.

18. The one or more machine-readable storage media of claim 17, wherein the plurality of instructions, when executed, further cause the apparatus to perform an error correction process on the second candidate data set to obtain the target data set in response to a determination that the second candidate ratio is within the selected predefined range of the predefined reference ratio.

19. A method comprising:
performing, by a controller of an apparatus and in response to a read request, a first read attempt of a target data set from a memory of the apparatus with a read parameter to obtain a first candidate data set;
determining, by the controller, a first candidate ratio of instances of data values in at least a first portion of the first candidate data set;
comparing, by the controller, the first candidate ratio to a predefined reference ratio;
selecting, by the controller, a predefined range as one of a first predefined range stored in association with a first error correction process and a second predefined range that is different from the first predefined range and is stored in association with a second error correction process that is different from the first error correction process;
determining, by the controller, whether the first candidate ratio is within the selected predefined range of the predefined reference ratio;
adjusting, by the controller, the read parameter in response to a determination that the first candidate ratio is not within the selected predefined range; and
performing, by the controller, a second read attempt of the target data set with the adjusted read parameter.

20. The method of claim 19, further comprising selectively increasing or decreasing a read reference voltage to adjust the read parameter.

21. The method of claim 19, further comprising:
identifying an error correction codeword associated with the first candidate data set; and
determining the first candidate ratio as a ratio of zeros to ones in the error correction codeword.

22. The method of claim 19, further comprising:
performing an error correction encode process on the target data set to generate an error correction codeword associated with the target data set;
combining the error correction codeword with a predefined set of data values; and
storing the target data set and the error correction codeword to the memory prior to the first read attempt.

23. The method of claim 19, further comprising:
performing an error correction encode process on the target data set to generate an error correction codeword associated with the target data set;
scrambling the error correction codeword; and
storing the target data set and the error correction codeword to the memory prior to the first read attempt.

24. The method of claim 23, further comprising performing an exclusive OR of a predefined pattern of ones and zeros with the error correction codeword to scramble the error correction codeword.

25. The method of claim 19, further comprising:
performing the second read attempt to obtain a second candidate data set; and
determining whether the second candidate data set has a second candidate ratio of data values in at least a first portion of the second candidate data set that is within the selected predefined range of the predefined reference ratio.

* * * * *